United States Patent [19]
Rambo

[11] 4,016,503
[45] Apr. 5, 1977

[54] HIGH-RELIABILITY POWER AMPLIFIER
[75] Inventor: Sheldon I. Rambo, Baltimore, Md.
[73] Assignee: Westinghouse Electric Corporation, Pittsburgh, Pa.
[22] Filed: July 24, 1975
[21] Appl. No.: 598,617
[52] U.S. Cl. .............................. 330/124 D; 330/53; 333/10
[51] Int. Cl.² .......................................... H03F 3/68
[58] Field of Search .................. 330/53, 124 D, 51; 333/10

[56] References Cited
UNITED STATES PATENTS

| | | | |
|---|---|---|---|
| 3,371,284 | 2/1968 | Englebrecht | 333/10 X |
| 3,423,688 | 1/1969 | Seidel | 330/53 |
| 3,426,292 | 2/1969 | Seidel | 330/53 X |

Primary Examiner—Rudolph V. Rolinec
Assistant Examiner—Lawrence J. Dahl
Attorney, Agent, or Firm—R. G. Brodahl

[57] ABSTRACT

A high-reliability power amplifier employs passive automatic switching between parallel amplifier channels to provide a constant output power level, which is independent of the failure of an individual channel. The reliability of the amplifier network is improved by amplifying the input signal through parallel channels. Passive switching between channels and a constant level of power output are provided through a hybrid junction.

5 Claims, 2 Drawing Figures

HIGH-RELIABILITY POWER AMPLIFIER

The invention herein described was made in the course of, or under a contract or subcontract thereunder, with the Department of the Air Force.

BACKGROUND OF THE INVENTION

1. Field of the Invention

The invention relates to high-reliability amplifiers employing passive, automatic switching between parallel channels.

2. Description of the Prior Art

For many years manual switching has been used to compensate for amplifier network failures by removing a defective amplifier from the network and replacing it with an operative amplifier. In unattended systems or systems where brief shutdowns cannot be tolerated, such as unattended phased array radar, automatic switching has been used to improve the reliability of amplifier networks. Unfortunately, such automatic switching requires comparatively complex circuitry and additional components which may themselves limit the reliability of a network in which they are included. Recently, there has been interest in using parallel amplifiers to provide a network of increased reliability resulting from the greatly lowered probability of joint failures compared with the probability of failure of a single amplifier. The present invention provides an amplifier network which improves reliability through automatic, passive swtiching between parallel circuits while providing a constant level of output power.

SUMMARY OF THE INVENTION

In a high-reliability power amplifier, first and second power amplifying channels are located in parallel and are provided with input signals of substantially the same power level and phase relationship from an input power signal which is divided through a first hybrid junction. The first amplifying channel contains a first amplifier and a phase shifter which changes the phase of the signal in a first channel 120° with respect to the signal in a second channel. The second amplifying channel contains a second amplifier. The signals in the first and second channels are combined in a second hybrid junction having first and second output signals. One output signal is terminated and the other output signal comprises the output signal for the power amplifier. The power level of the power amplifier output signal is substantially one-half the power level of either the first or second amplifiers. If an open or short circuit occurs in the first amplifying channel, the amplifier output power level and phase remain the same. If an open or short circuit occurs in the second amplifying channel, the amplifier output power level remains the same, but the phase of the output signal shifts 120°.

DESCRIPTION OF THE PREFERRED EMBODIMENT

Figure 1:
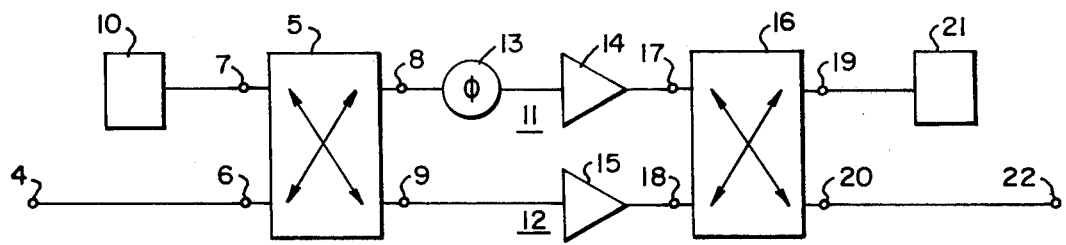
FIG. 1 is a block diagram of a preferred embodiment of the disclosed power amplifier apparatus.

The disclosed amplifier apparatus provides high-reliability by distributing the probability of failure of a particular amplifier between parallel channels. The amplifier also provides automatic passive switching between channels and a constant power level output upon the failure of either amplifier by shifting the phase of the signal in one channel by 120° with respect to the phase of the signal in the other channel and combining the amplified signals in a hybrid junction.

That the reliability of a power amplifier is improved by amplifying the signal through parallel redundant channels may be demonstrated as follows: if "A" is the probability of success of an amplifier in a first channel, and "B" is the probability of success in a second channel, the probability of success Ps in parallel combination would be:

$$P_s = A + B - A*B \qquad (1)$$

For example, if $$A = B = .99, P_s = .9999$$

The constant power level output and passive switching between parallel channels of the disclosed high-reliability amplifier is based on the properties of a hybrid junction, for example, a short slot hybrid junction. Because of its symmetry, the hybrid junction will divide the signal provided to first and second input ports equally between first and second output ports. However, a signal provided to the first input port will divide equally and in-phase between the output ports, with zero coupling the first input port; while a signal provided to the second input port will divide equally between the output port, with zero coupling the first input port but with 180° phase difference. This 180° phase difference between signals in the output ports due to a signal provided to the second input port provides the potential for a continuous cancellation of signals in the hybrid junction which makes passive switching between parallel channels at a constant power level possible. As used here, passive switching means that an open or short circuit condition in a channel will cause that channel to be switched out of the amplifier network.

It can be mathematically demonstrated that a hybrid junction can maintain a constant output power level through passive switching between parallel channels. The power output Po for the second output port of the hybrid junction is described by the generic equation:

$$Po = \tfrac{1}{2} \sum_{m=1}^{2} \sum_{n=1}^{2} E_m E_n e^{j(\theta_m - \theta_n)} \qquad (2)$$

where $E_1$ is the power of the input signal to the first port, $E_2$ is the power of the input signal to the second port, $\theta_1$ is the phase angle of the first input signal, and $\theta_2$ is the phase angle of the second input signal. Equation (2) may be equivalently expressed as:

$$Po = \frac{E_1^2 + E_2^2}{2} + E_1 E_2 \cos(\theta_1 - \theta_2) \qquad (3)$$

It can be seen from Equation (3) that, if the first input signal fails, $$E_1 = 0 \qquad (4)$$

and $$Po = E_2^2/2 \qquad (5)$$

Also, it is seen that if the second input signal fails, $$E_2 = 0 \quad (6)$$

and $$Po = E_1^2/2 \quad (7)$$

One condition is that the output power level remains the same for the failure of either amplifier. If the power level of the first and second input signals is the same, $$E_1^2/2 = E_2^2/2 \quad (8)$$

so that, from Equations (4) through (8), it is seen that the output power level would remain the same upon failure of either input signal.

To maintain a constant output power level, it is also a condition that the output power when both the first and second input signals are provided equal the output power when either input signal has failed. Substituting Equation (8) in Equation (3) results in:

$$Po = E_1^2 (1 + \cos(\theta_1 - \theta_2)) \quad (9)$$

Equation (9) shows that by controlling the relative phase angle of both input signals, the output power when both the first and second signals are provided can be made equal to the output power when either input signal has failed. Substituting Equation (7) in Equation (9) and solving for $(\theta_1 - \theta_2)$ it is found that the required phase relationship is:

$$\theta_1 - \theta_2 = 120° \quad (10)$$

Therefore, by providing the hybrid junction with input signals of equal power levels which are at a phase angle of 120° with respect to each other, the output power level of the hybrid junction would remain unchanged upon the failure of either input signal. From the foregoing discussion, it is recognized that parallel amplifying channels supplying signals of substantially equal power and at a relative phase angle of 120° to the input ports of a hybrid junction will provide a high-reliability amplifier network which employs passive switching between parallel channels to maintain a constant output power level upon the failure of either amplifier.

A preferred embodiment of the disclosed high-reliability power amplifier is shown in the block diagram of FIG. 1. A waveguide power amplifier input port 4 is connected to a short slot hybrid waveguide junction 5 which has ports 6, 7, 8 and 9. Port 7 is connected to a terminating load 10 and ports 8 and 9 are connected to parallel waveguide channels 11 and 12 respectively. Channel 11 includes a twin-slab phase shifter 13 and a solid state amplifier 14, and channel 12 includes a solid state amplifier 15. Parallel waveguide channels 11 and 12 provide input signals to a short slot hybrid junction 16 having input ports 17 and 18 and output ports 19 and 20. Hybrid output port 19 is connected to a terminating load 21 and hybrid output port 20 is connected to the power amplifier output port 22.

In the ideal case, a power signal provided to input port 4 is divided equally between waveguide channels 11 and 12 through ports 8 and 9 of short slot hybrid 5. The signal delivered to channel 11 is phase-shifted 120° by phase shifter 13 and then amplified by solid state amplifier 14. The signal delivered to channel 12 is amplified by solid state amplifier 15. The respective amplified signals of waveguide channels 11 and 12 are then provided to the input ports 17 and 18 of short slot hybrid junction 16. Output port 20 of hybrid junction 16 provides the output signal for the high-reliability amplifier network through waveguide output port 22. As explained in relation to Equations (2) through (10), the power output of the amplifier network is substantially equal to one-half the power output of amplifiers 14 or 15. Terminating loads 10 and 21 are provided to absorb output signals which appear at ports 7 and 19 as conditions in short slot hybrid junctions 5 and 16 vary from the ideal case assumed in the development of Equations (2) through (10). Considerable departure from the ideal conditions assumed is permissible before the desired operation of the high-reliability amplifier network becomes ineffective.

Although the preferred embodiment is in a waveguide media, it will be appreciated that the device could also be constructed in a coaxial, strip line, low frequency inductive hybrid or other media by using components suitably analogous to those herein described.

Figure 2:
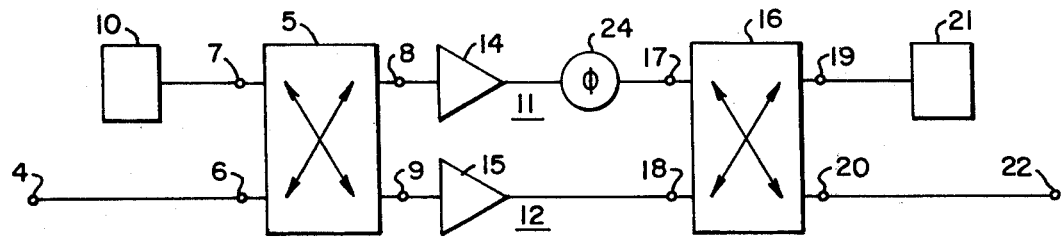
FIG. 2 is a block diagram of an alternative embodiment of the disclosed power amplifier apparatus.

FIG. 2 is a block diagram of an alternative embodiment of the disclosed high-reliability power amplifier in which waveguide channel 11 includes a well known Reggia-Spencer phase shifter 24 located on the output side of amplifier 14. The embodiment of FIG. 2 is operative in substantially the same manner explained in relation to FIG. 1. However, since the phase shifter 13 of FIG. 1 is on the input side of amplifier 14, it generates less heat and, for mobile applications, requires smaller power supplies than the phase shifter 24 of FIG. 2. In addition, the phase shifter 13 of FIG. 1 may require less expensive driver-circuit components than the phase shifter 24 of FIG. 2.

I claim:

1. A power amplifier having passive switching between first and second amplifying channels to improve the reliability of said amplifier, said power amplifier comprising:
   a first amplifying channel for providing a first power signal of a predetermined power level;
   a second amplifying channel for providing a second power signal having a power level substantially equal to the predetermined power level of said first signal;
   means for shifting the phase of said first power signal approximately 120° with respect to the phase of said second power signal; and
   a hybrid combiner connected to said first and second channel, said combiner being responsive to one of said first and second power signals at times when only one of said signals is present, and responsive to both of said first and second signals at times when both of said signals are present to provide a power output signal of a substantially constant power level.

2. A power amplifier having passive switching between first and second amplifying channels to improve the reliability of said amplifier, said amplifier comprising:
   means for dividing an input power signal into first and second amplifying channels;
   means for shifting the phase of a power signal in said first channel substantially 120° with respect to the phase of a power signal in said second channel;
   first means for amplifying the shifted power signal of said first channel;
   second means for amplifying the power signal of said second channel; and a hybrid combiner that is responsive to the power signals of both of said first and second channels when both of said signals are present, and that is responsive to the power signal of one of said first or said second amplifying channels when only one of said signals is present, to provide a power output signal of a substantially constant power level.

3. A power amplifier having passive switching between first and second parallel amplifying channels to improve the reliability of said amplifier, said amplifier comprising:

power dividing means for separating an input signal into a first power signal of a predetermined power level and a second power signal of a predetermined power level substantially equal to the power level of said first signal;

a first amplifier for amplifying the power of said first power signal;

means for shifting the phase of said first power signal substantially 120° with respect to said second power signal; and a second amplifier for amplifying the power of said second power signal; and a hybrid combiner that is responsive to both of said first and second power signals when both of said signals are present, and that is responsive to one of said first or said second power signals when only one of said signals is present to provide an ouput signal of substantially constant power level.

4. A method for passive switching between first and second amplifying channels to provide high-reliabilty in a power amplifier, said method including:

dividing the input power signal into first and second amplifying channels;

shifting the phase of the power signal in the first channel substantially 120° with respect to the phase of the power signal in the second channel;

amplifying the shifted power signal of the first channel;

amplifying the power signal of the second channel; and a hybrid combiner that is responsive to the power signals of both of said first and second channels when both of said signals are present, and that is responsive to the power signal of one of said first or second amplifying channels when only one of said signals is present to provide an output signal of a substantially constant power level.

5. A power amplifier comprising:

a hybrid junction having a pair of input ports and an output port, a first amplifying channel connected to one of said input ports operative to generate an input signal of a first amplitude to govern the input signal to one input port to cause said junction to conduct at its output port an output signal of a second amplitude at times when only the input signal of said first channel is applied to the hybrid junction, a second amplifying channel connected to the other of said input ports operative to generate an input signal having an amplitude substantially equal to the first amplitude to govern the input signal to the other input port to cause said junction to conduct at its output port an output signal of said second amplitude at times when only the input signal of the second channel is applied to the hybrid junction; and means to shift the phase of the input signal of one of said channels relative to the input signal of the other of said channels an amount sufficient to govern the input signals to the input ports to cause said junction to conduct at its output port an output signal of substantially said second amplitude at times when the input signals of both the amplifying channels are present.

* * * * *